(12) United States Patent
Rummens

(10) Patent No.: US 8,590,224 B2
(45) Date of Patent: Nov. 26, 2013

(54) PROFILES FOR FIXING RIGID PLATES

(71) Applicant: Francois Rummens, Brussels (BE)

(72) Inventor: Francois Rummens, Brussels (BE)

(73) Assignee: Renolit Belgium N.V., Oudenaarde (BE)

( * ) Notice: Subject to any disclaimer, the term of this patent is extended or adjusted under 35 U.S.C. 154(b) by 0 days.

(21) Appl. No.: 13/648,554

(22) Filed: Oct. 10, 2012

(65) Prior Publication Data

US 2013/0032191 A1 Feb. 7, 2013

Related U.S. Application Data

(62) Division of application No. 12/865,694, filed as application No. PCT/EP2009/000661 on Feb. 2, 2009, now abandoned.

(30) Foreign Application Priority Data

| Feb. 2, 2008 | (EP) | ................................ | 08001974 |
| Jul. 2, 2008 | (EP) | ................................ | 08011917 |
| Jul. 18, 2008 | (EP) | ................................ | 08012991 |
| Oct. 10, 2008 | (EP) | ................................ | 08017870 |

(51) Int. Cl.
*E04D 13/18* (2006.01)

(52) U.S. Cl.
USPC ............................. 52/173.3; 52/582.1

(58) Field of Classification Search
USPC ............ 52/222, 173.3, 586.1, 586.2, 582.1, 52/656.1, 665, 726.2; 126/621, 622, 623, 126/704
See application file for complete search history.

(56) References Cited

U.S. PATENT DOCUMENTS

| 5,409,549 | A | 4/1995 | Mori | |
| 5,505,788 | A | 4/1996 | Dinwoodie | |
| 5,986,203 | A | 11/1999 | Hanoka et al. | |
| 6,065,255 | A | 5/2000 | Stern et al. | |
| 6,105,317 | A | 8/2000 | Tomiuchi et al. | |
| 6,184,057 | B1 * | 2/2001 | Van Andel et al. | ............. 438/66 |
| 6,331,673 | B1 | 12/2001 | Kataoya et al. | |
| 6,437,235 | B1 | 8/2002 | Komori et al. | |
| 6,729,081 | B2 | 5/2004 | Nath et al. | |
| 6,809,251 | B2 | 10/2004 | Dinwoodie | |
| 7,102,074 | B2 | 9/2006 | Yen et al. | |
| 7,259,030 | B2 * | 8/2007 | Daniels et al. | ................... 438/22 |
| 7,276,658 | B2 * | 10/2007 | Dubbeldam | .................. 136/256 |
| 7,299,591 | B2 | 11/2007 | Broatch | |

(Continued)

FOREIGN PATENT DOCUMENTS

| DE | 298 24 045 U1 | 3/2000 |
| EP | 0 769 818 A2 | 4/1997 |

(Continued)

OTHER PUBLICATIONS

International Search Report, PCT/EP2009/000661, Jun. 4, 2009, 3 pgs.

(Continued)

*Primary Examiner* — William Gilbert
*Assistant Examiner* — Gisele Ford
(74) *Attorney, Agent, or Firm* — Paul D. Strain, Esq.; Strain & Strain PLLC

(57) ABSTRACT

The present invention relates to profiles for attaching rigid plates, especially photovoltaic modules, to a roof and to a method and system for attaching photovoltaic modules to a roof structure with the help of profiles.

27 Claims, 9 Drawing Sheets

(56) References Cited

U.S. PATENT DOCUMENTS

| | | | |
|---|---|---|---|
| 7,618,310 B2 | 11/2009 | Daniels | |
| 7,723,733 B2 * | 5/2010 | Daniels et al. | 257/80 |
| 7,773,064 B2 * | 8/2010 | Doane et al. | 345/87 |
| 7,796,103 B2 * | 9/2010 | Doane et al. | 345/87 |
| 7,810,286 B2 | 10/2010 | Eiffert et al. | |
| 7,814,899 B1 | 10/2010 | Port | |
| 7,863,760 B2 * | 1/2011 | Daniels et al. | 257/787 |
| 7,921,843 B1 | 4/2011 | Rawlings | |
| 7,971,398 B2 | 7/2011 | Tweedie | |
| 7,982,126 B2 * | 7/2011 | MacFarlane | 136/246 |
| 8,158,450 B1 * | 4/2012 | Sheats et al. | 438/57 |
| 8,197,928 B2 * | 6/2012 | Volpp et al. | 428/220 |
| 8,318,316 B2 * | 11/2012 | Muckenhuber | 428/475.2 |
| 8,333,040 B2 * | 12/2012 | Shiao et al. | 52/173.3 |
| 8,438,796 B2 * | 5/2013 | Shiao et al. | 52/173.3 |
| 8,458,967 B2 * | 6/2013 | Kalkanoglu et al. | 52/173.3 |
| 2002/0050287 A1 * | 5/2002 | Yamada et al. | 136/251 |
| 2003/0034064 A1 | 2/2003 | Hatsukaiwa et al. | |
| 2007/0000537 A1 * | 1/2007 | Leidholm et al. | 136/252 |
| 2007/0062573 A1 | 3/2007 | Ferri et al. | |
| 2010/0200061 A1 * | 8/2010 | Melchior | 136/256 |
| 2010/0224235 A1 * | 9/2010 | Takagi et al. | 136/251 |
| 2011/0017278 A1 * | 1/2011 | Kalkanoglu et al. | 136/251 |
| 2011/0041429 A1 | 2/2011 | Rummens et al. | |
| 2012/0208033 A1 * | 8/2012 | Weigel et al. | 428/447 |

FOREIGN PATENT DOCUMENTS

| | | |
|---|---|---|
| EP | 1 443 158 A | 8/2004 |
| EP | 1 777 357 A1 | 4/2007 |
| GB | 2 438 526 B | 5/2009 |
| WO | WO 98/13882 A1 | 4/1998 |
| WO | WO 2004/066324 A2 | 8/2004 |
| WO | WO 2006/089044 A2 | 8/2006 |
| WO | WO 2010/053936 A1 | 5/2010 |

OTHER PUBLICATIONS

Rummens, U.S. PTO Office Action, U.S. Appl. No. 12/865,694, Jan. 11, 2012, 15 pgs.

Rummens, U.S. PTO Office Action, U.S. Appl. No. 12/865,694, May 10, 2012, 15 pgs.

European Search Report, Appl. No. 12006740.0, Jun. 17, 2013, 5 pgs.

* cited by examiner

PROFILES FOR FIXING RIGID PLATES

CROSS-REFERENCE TO RELATED PATENT APPLICATIONS

This application is a Divisional of U.S. application Ser. No. 12/865,694, filed Nov. 8, 2010, which is a National Stage of International Application No. PCT/EP2009/000661, filed Feb. 2, 2009, which is based upon and claims the benefit of priority from prior European Patent Applications No. 08001974.8, filed Feb. 2, 2008, No. 08011917.5, filed Jul. 2, 2008, No. 08012991.9, filed Jul. 18, 2008, and No. 08017870.0, filed Oct. 10, 2008, the entire contents of all of which are incorporated herein by reference in their entirety.

The present invention relates to profiles for attaching rigid plates, especially photovoltaic modules, to a roof and to a method and system for attaching rigid plates, especially photovoltaic modules to a roof structure.

BACKGROUND OF THE INVENTION

Roofs are an ideal place to install photovoltaic modules. Rigid Si photovoltaic modules are very well known but are difficult to handle (they are heavy) and require expensive heavy frames to install them on the roof.

To make a.o. a commercial (i.e. essentially flat) roof watertight, it is well known to use a polymeric or a bituminous waterproofing membrane as a top layer of the roof (commercial buildings). In the case of a roof having on its top a waterproofing membrane, many penetrations of this membrane will generally be required to install the frames for the rigid Si photovoltaic modules. All these penetrations may lead to leakage and to cold bridges (leading to condensation inside the roof structure). Moreover not all roof structures are suited to carry heavy frames, which will catch the wind (sail effect). On a pitched roof this is also not aesthetical.

U.S. Pat. No. 5,505,788 describes a support system of spacers (profiles) and/or insulation panels supporting PV modules. The spacers or panels supporting the PV modules are loosely laid on the waterproofing membrane. They are interlocked but need to be further secured on the roof against wind up-lift forces by pavers at their perimeter. With such system, the slope of the modules (tilt angle) is anyway limited due to the wind up-lift resistance and due to shading issue (the modules are close to each other because their substrate or support must be "interlocking"; therefore modules installed with a high tilt angle will cast shadow on the modules behind). The weight of the pavers may further be incompatible with the load bearing capacity of many commercial buildings.

U.S. Pat. No. 6,729,081 describes a light weight photovoltaic module which is self-adhesive and can in principle be glued onto the waterproofing membranes in a cost effective way and without the use of fasteners which perforate the waterproofing membrane and the insulation panels. Gluing operations are however quite delicate on the roof. The (self-) adhesive may be further not compatible with the existing waterproofing membrane. Gluing of such photovoltaic modules directly onto the waterproofing membrane will also block or at least much reduce the water vapor permeability of the waterproofing membrane, leading potentially to condensation problems inside the roof structure and/or to damages to the photovoltaic cells and/or to internal delamination of the encapsulating layers of the photovoltaic modules.

Another way to obtain a roof with flexible photovoltaic modules attached onto it is to use, as waterproofing membrane, a waterproofing membrane with factory laminated flexible light weight photovoltaic modules on top of it. Such waterproofing membranes are produced by companies like SIT (Solar Integrated) in the USA or by Alwitra in Germany. They consist of several elongated modules supplied e.g. by United Solar Ovonic (Uni-Solar modules) glued in parallel to the polymeric waterproofing membrane. The several Uni-Solar modules are connected in serial under the waterproofing membrane. The connections/soldering are protected (encapsulated) by cast polyamide or cast epoxy or cast polyurethane resin or by similar system. Such photovoltaic waterproofing membranes and systems are described e.g. in DE 29824045 U1 and WO2004066324 A2.

The known photovoltaic waterproofing membranes suffer from several drawbacks:
  Risk of formation of creases during installation because of the differential internal tensions.
  the modules are very easy to steal.
  Internal tension as a result of thermal cycli (sun-night) due to the poor matching of the coefficients of dilatation of the modules and of the polymeric films, sheets and glues.
  The water vapor permeability trough the sheet is partly blocked resulting into:
    Increased condensation into the insulation panels.
    Increased risk of delamination of the internal layers of the photovoltaic modules.
  a higher temperature of the photovoltaic module compared to an installation on a not insulated substrate. and the temperature inside the building will be increased.
  These membranes are difficult to install as the insulation panels have to be partly cut out (carved) to encompass the connection and cables.
  Difficulty to access the connections (which are under the welded membranes when installed, meaning that the membrane has to be cut).
  The choice of the insulation material is limited to such with high reaction to fire.
  Parts of the waterproofing membrane cannot be covered with photovoltaic modules.
  They are expensive because they are produced in two steps (production of the PV modules in the first step and lamination in a second step).

These photovoltaic waterproofing membranes may also be installed on top of the existing waterproofing membrane, as a panel, by welding them on the existing waterproofing membrane.

Water may accumulate between the photovoltaic panel and the waterproofing membrane. This may lead to development of micro-organisms which will attack/damage the waterproofing membrane (especially with plasticized poly vinyl chloride (P-PVC)) and/or the module.

Thus, it is an object of the present invention to propose a safe (fire-, wind-, strain-safe) and practical system to attach photovoltaic modules on a roof without the drawbacks of the existing systems.

Especially, the system shall preserve water vapor permeability of the roof and reduce the photovoltaic module temperature and exposition to humidity, extending its durability and avoiding exceeding the critical 85° C. at the adhesive level even in the South of Europe.

The above mentioned objects are achieved by using soft profiles with rigid inserts for fixing photovoltaic modules to a roofing structure and by a method of fixing comprising the steps of providing a rigid substrate to which photovoltaic modules are attached, providing profiles, fixing them on the roofing structure and attaching the modules to the profile. The problems are further solved by a system for attaching these photovoltaic modules to a roofing membrane. To simplify matters the description will refer to photovoltaic modules it being understood that the profiles, method and system of the invention are suited to attach any kind of rigid plate or mounting frame or tracking system on a roof.

The method and system according to the invention improves the durability of the photovoltaic modules, the durability of the glues and connections, the durability of the roofing membranes and reduces the heating cost and/or electricity consumption for air conditioning.

The modules and method according to the invention will reduce the risk of proliferation of micro-organisms which may damage roofing membranes. It will limit the strain, e.g. due to wind up-lift, material shrinkage (loss of plasticizer), material swelling (water take-up) and by dilatation, on the modules and connections. It can be made theft-proof, allowing to easily remove the modules with a suitable tool, while avoiding unwanted removal by thieves.

The object of the present invention is solved in particular by attaching, preferably by gluing, typically inexpensive photovoltaic modules/cells, possibly with improved formulation and composition of their back sheet, on a rigid metal sheet or on an optionally glass reinforced plastic sheet (composite sheet). Then, these rigid metal sheets or these preferably glass reinforced plastic sheets are fastened on the roof to the (partly) soft profiles with rigid inserts, said profiles being beforehand attached, preferably heat welded on the waterproofing membrane. The profiles have to be soft at least at their membrane facing side because otherwise temperature changes and other stresses could lead to damages of the membrane like creases or cracks. Alternatively, instead of fastening the rigid metal sheets or the preferably glass reinforced plastic sheets with the help of rigid insert, the upper part of the profile may be rigid and play the role of the insert.

According to the invention the modules are installed with the help of profiles. To this end, profiles are attached to the roof by one of welding, gluing and mechanical fixing means like nails, screws or hook and loop. The waterproofing membrane (and modules) are preferably sealed with the profiles. The profiles can take the form of singular molds, e.g. cup-shaped. Alternatively the profiles can take the form of strips with legs provided on the modules, e.g. as part of the rigid sheet, the rigid sheet being possibly equipped at its rear side with feet (profiles or cup-shaped).

Preferably, soft profiles with a rigid (e.g. metallic) insert are welded/glued to a previously (also years earlier) installed waterproofing membrane. The profiles are preferably equipped with flaps to ease welding, to improve sealing to the waterproofing membrane and to spread wind up-lift forces. The rigid, metal or preferably glass reinforced plastic sheet of the photovoltaic modules is attached (e.g. with stainless steel screws or with clips or with glues like MS (modified silicone) polymers) on the upper (rigid) part of the profile or to the insert (with screws drilling through the plastic profile). Profiles/rails or punctual fasteners/clamps may be used to attach the modules, depending on the geometry of the PV modules. It will be recognized that these methods consisting of attaching the rigid metal or glass reinforced plastic sheets with the photovoltaic modules, to profiles attached to the waterproofing membrane, do not require to perforate the waterproofing membrane.

Self drilling screws (corrosion resistant like stainless steel screws) are preferred and well known in the art. The screws (self-drilling or not) may also be long enough to attach the waterproofing membrane to the roof substrate. In this case the metal or rigid glass reinforced plastic sheets advantageously replace the pressure repartition plate of the classical mechanical fasteners. The welded profile should in this case be a "filled" (not hollow) profile to keep the roof watertight as the waterproofing membrane is in this particular embodiment, perforated.

Sealing means like rubber patches (EPDM, butyl, . . . ) and/or silicone beads, preferably butyl sealing patches may be used to improve the waterproofing and the corrosion resistance of the connection (screws+metal sheet) between the metal sheet/rigid plastic sheet and the profiles/inserts. The upper part of the profile is, if necessary, designed to be compatible with these butyl patches. Thermo-resistant rigid PVC (e.g. wood composites) as upper part (for soft PVC base) is for instance adequate.

Preferably the profile has flaps at its bottom to allow for a sealing of the profile with the waterproofing membrane. The flaps can be of the same, a similar or some other material(s) than the profile. The flaps are preferably made from a material compatible with the material of the waterproofing membrane, i.e. weldable thereto. They are in one preferred variant made from the same or a similar material and more preferred integrally with the profile. They can also be made from a different material, e.g. when the material of the profile differs from that of the waterproofing membrane. The flaps may be sealed to the membrane by welding or gluing, preferably they can be sealed by welding.

The flaps can also serve the purpose of attaching the profile to the waterproofing membrane and/or the roof. In one variant they preferably carry a hook and loop fastener. The second, corresponding part of the hook and loop fastener is attached to the waterproofing membrane or the roof and the profile attached by pressing both parts of the fastener onto each other. The profile can take the from of a strip in this variant. In another preferred variant the flaps are weldable to the membrane. With the help of flaps one can also attach a e.g. PVC profile to a e.g. bituminous waterproofing membrane. The flaps are made from a material weldable to the membrane and are attached and/or sealed to the profile. The profile can then be welded to the membrane with the help of the flaps.

The upper part of the profile may be discontinuous/interrupted (extrusion flow periodically interrupted for the upper part or upper part of the profile periodically cut out) to be more cost effective, more flexible (with less stress by dilatation and allowing for attachment to curved roofs), to better fit e.g. with corrugation or ribs or folded edges of metal substrate and to ease the introduction of a metallic insert. Such profiles may be produced as follow: During the extrusion process of the profile, the flow of the part of the profile above the flaps part may be interrupted or the part of the profile above the flaps part may be periodically cut out (e.g. by a moving knife system after the die) and the scraps recycled. The rigid part of the profile is interrupted every length of less than 1 m, typically of less than 50 cm. The interruption of the upper part of the profile should match the size (width) of the rigid sheets to be fastened onto the profile. In case of use of hollow profiles with inserts, the use of "interrupted profiles" will additionally help to introduce the insert into the profile. If the profile has a rigid top part, the interruption will additionally solve the problem of dilatation of the rigid top part (with the related stresses). The interruption can be foreseen for the whole height of the profile in the case of profiles with flaps, so that the profile is reduced to a strip between the fixing areas. The interruption can also relate to part of the profile height. The remaining height of the profile can advantageously be utilized during fixing the profile to a roofing structure since a welding machine can be constructed to be guided by the remaining height of the profile.

In one mode the invention provides waterproofing membrane in the form of a polymeric watertight flexible sheet with integrated hollow polymeric profiles. The sheet with the integrated profiles is preferably produced in a one step extrusion process, by combining flat die extrusion and extrusion of profiles. Useful techniques, especially regarding the extrusion of profiles, tubes and cables (sheathing), injection of blowing air into tubes, etc are extensively described in the literature e.g. in "Les matières plastiques: Structure, Propriétés, Mise en Oeuvre, Norme. Editions de l'usine".

It is also possible to lay the metallic inserts (preferably a rectangular insert) on the waterproofing sheet. To avoid damage to the waterproofing sheet, e.g. double face self-adhesives sealing strips may be laid between the sheet and inserts at least at the ends of the inserts (protection against sharp edges). Strips of sheets like waterproofing sheets (possibly reinforced) are then laid and possibly glued around the metallic inserts, with flaps welded to the waterproofing sheet. The strips form a profile with welded flaps around the metallic inserts. The metallic inserts may contain a sealing foam. Sealing strips may be glued between inserts and sheets to improve sealing performances in case of perforation of the profile, insert and waterproofing sheet by mechanical fasteners.

In an especially preferred embodiment the invention provides a system of profiles comprising soft polymeric profiles with a rigid insert for fixing to a waterproofing sheet and secondary profiles for attaching and arranging photovoltaic modules. The secondary profiles are attached to the profiles in an angle, preferably approximately rectangular to the first profiles. This system increases the flexibility of arrangement of the photovoltaic modules on the roof.

The secondary profiles may be part of the frames or sheets of the PV modules (module with flaps) or installed separately. These profiles can have any appropriate shape and length. Preferably they are metallic or from another rigid material. The length is advantageously chosen so that at least two photovoltaic modules can be attached to one secondary profile, preferably the length is such that it covers the whole area in which photovoltaic modules are intended to be installed. Suitable forms of the secondary profiles are a U-shape or a T-shape or a L-shaped, or a rectangle shape, which provide flat parts for fixing of the secondary profiles to the polymeric profiles and rims/edges for attaching the photovoltaic modules (or their mounting frames). The arrangement and distance of the secondary profiles is adapted to the size of the photovoltaic modules. The angle between the polymeric and the secondary profiles can be chosen as desired. It is advantageous to choose an angle that brings the photovoltaic modules in an optimal orientation relative to the sun, i.e. approximately southwards. Of course, orientation of the building and other circumstances like objects blocking the sunlight from a certain direction have to be taken into account. The profiles must also be installed to allow rain water to escape.

Attaching of the photovoltaic modules is facilitated according to the invention. Since the secondary profiles have no sealing function, the fixing means for the modules may be much simpler. Positioning is also easier due to the length of the secondary profiles providing an extended area for fixing. This will prevent stresses on the roofing structure, too. Any fixing means known per se may be used to attach the photovoltaic modules to the secondary profiles. Communicating forms for clicking the modules, suitably with its frame onto the profiles, screws, bolts and so on may be used. Preferably the photovoltaic modules are laid on the secondary profiles and attached to them with fasteners and metallic profiles or clamps or hinges. The photovoltaic modules may be mounted to the secondary profiles in the factory (e.g. by a flaps system with hinges). The fasteners may perforate the secondary and also the polymeric profiles. Self drilling stainless steel screws are preferred, especially for aluminum inserts. Hinges, profiles/rails or punctual fasteners/clamps may be used to attach the modules, depending on the geometry of the photovoltaic modules. To increase electricity production, the modules may be installed on the roof with an angle with the sheet and polymeric profiles, i.e. the surface of the module is not parallel to the surface of the roof. Especially in this case, the rigid inserts (FIG. 1c) or the secondary profiles (FIG. 1b) should preferably have a length of more than 2 m, preferably of more than 3 m to obtain a load repartition effect (ski effect) on the roof against the tilting forces of the wind.

For a very strong connection (high wind load) of the secondary profiles and/or PV modules to the roof structure, it is possible to perforate the soft polymeric profiles, inserts and waterproofing sheet with adequate screws to connect the secondary profiles and/or PV modules to the roof structure. In this case, the polymeric profiles must be connected to the waterproofing sheet in a 100% durable watertight way to avoid water infiltration.

If the waterproofing sheet is an existing waterproofing sheet (i.e. the waterproofing sheet has been previously installed on an existing roof), the soft profiles will be attached (e.g. welded) on the existing roof on site. In this case, it is preferred not to perforate the waterproofing sheet with the mechanical fasteners which are required to secure the PV modules or secondary profiles onto the roof. Indeed, it is very difficult to obtain a totally defect free connection (i.e. a watertight connection without some little infiltrations) between the soft profiles and the waterproofing sheet, as a result of dirt and several pollutants which adhere to the existing waterproofing sheet. It has been surprisingly discovered anyway that the polymeric profiles, preferably with soft flaps, spread efficiently the wind up-lift forces on the waterproofing sheet and assure a strong although soft (no damage to the waterproofing sheet by dilatation-contraction cycli) connection of the PV modules and/or secondary profiles to the roof. In most of the case, the PV modules and/or secondary profiles need only to be attached to the polymeric profiles and inserts. The fasteners don't need to perforate the waterproofing sheet.

The photovoltaic modules which are useful for this invention may consist of any type of photovoltaic cells and contain, between the metallic back-electrode and the transparent front-electrode, as active material (junctions) e.g.: a-Si, tandem cell (a-Si, a-Si or a-Si, microcrystalline silicon, . . . ), triple junction a-Si/a-SiGe/a-SiGe, Organic PhotoVoltaic (OPV), CIGS, and/or Cadmium Telluride thin films. The photovoltaic modules which are useful for this invention may be with or without frame. Thermal solar modules may also be attached to the roof with the profiles and systems of this invention.

Typically, the cells are e.g. built or transferred on a metallic foil (stainless steel, copper, . . . ) or a plastic film (PET, PEN, Polyimide, . . . ) with the right texture, as known per se. This foil or film is here also called the substrate of the cell.

For achieving low-cost mass production, the cells are usually built on plastic films and serial connected in strips of around 5 to 25 mm, like e.g. described in WO 98/13882 (for example by lift-up, laser, etching and silk printing of Ag paste processes, . . . ). These types of cells and serial connections, while being cost effective, withstand only little strain and will be sensitive to storms and to usual stresses during e.g. works on the roof, etc. especially if the photovoltaic modules are built (encapsulated) only with plastic films or foils (low rigidity compared to metal) and installed according to the previous art (DE 29824045 U1 and WO 2004066324 A2) and/or on relatively soft insulation panels.

The cells may also be built on stainless steel foil, typically 40 cm wide and 120 µm thick. The typically 120 µm foil is cut in rectangles of typically 40 cm*30 cm and connected in serial with metal strips and encapsulated to obtain a photovoltaic module. Such modules are less sensitive to strain. They are available e.g. from Uni-Solar (United Solar Ovonic). The production process is more expensive and needs by-pass diodes to function properly (shadow effect). It may bring higher lightning risk and electrical break-down risk. A dielectric film (PET, PA . . . ) is required.

Since the present invention aims to provide cost effective and safe photovoltaic roof solutions, the photovoltaic modules should preferably but not mandatory contain cost effective cells.

Typically the photovoltaic modules attached to the rigid metal or preferably glass fiber reinforced plastic sheet according to this invention have from the top (sky face) to the bottom (roof face) the following composition (connections not described):
a) A transparent front sheet preferably of fluoropolymer (typically 50 to 200 µm of ETFE, FEP, PVDF/acrylic . . . , containing required stabilizer and preferably long lasting UV absorbers) generally surface treated to improve adhesion of layer b)
b) A transparent adhesive layer (EVA, ionomers, etc.; total thickness 100 to 1500 µm) or layers which are flexible and impact resistant but usually have poor fire resistance.
c) A plastic or metallic film/foil which carries the active layers (TCO—photovoltaic junction—back electrode) on top of it, if relevant, with serial connections.
d) A back layer comprising:
   an adhesive layer or coextruded layers (tie-layer/TPO/tie-layer), preferably opaque and if required flame retarded, to provide adhesion of the plastic or metallic cell substrate (c) to the lower metal or rigid plastic sheet (back sheet). The flame retardant is preferably on base of halogen flame retardants (e.g. Saytex 8010®) with $Sb_2O_3$, acting in the gas phase (flame retardants releasing substances which "poison" the combustion in the gas phase). Adhesive layers or tie layers may be EVA films or hot-melts, tie layers on base of polyolefin copolymers with acrylic acid (EAA) or grafted with maleic anhydride, epoxy glues, PUR glues, etc, and will be chosen by the man skilled in the art to obtain good adhesion between the cell substrate film and the coated metal sheet or rigid plastic sheet.
   Optionally a dielectric film may be included.
e) A lower metal foil (Aluminum, Epoxy coated steel, . . . ) or rigid plastic sheet (glass reinforced PP, Polyester, Epoxy, . . . ).

Alternatively, the photovoltaic modules according to this invention may also have from the top (sky face) to the bottom (roof face) the following composition (connections not described):
a) A transparent, typically 4 mm thick, tempered glass
b) A transparent adhesive layer (EVA, ionomers, . . . ; total thickness 200 to 1500 µm) or layers which are flexible and impact resistant.
c) Rigid Silicium cells (typically 300 µm thick) or a plastic or metallic foil which carries the active layers (TCO—photovoltaic junction—back electrode) on top of it.
d) A back layer comprising:
e) An adhesive layer or coextruded layers (tie-layer/TPO/tie-layer) preferably opaque and flame retarded, to provide adhesion of the silicium or plastic or metallic cell substrate (c) to the lower metal or rigid plastic sheet (back sheet).
f) Optionally a dielectric film may be included.
g) A lower metal (Aluminum, Epoxy coated steel, . . . ) or glass (with frame) or rigid plastic sheet (glass reinforced PP, Polyester, Epoxy, . . . ) or a metal frame with classical backsheet (Tedlar/aluminium/PET, etc. . . . ) preferably with flaps. The module may be rigidified and protected against "edge damage" by an Aluminium protective frame. Such modules are mounted and fixed to a mounting frame with e.g. rigid flaps to provide a tilt angle on the roof. Such mounting frames are known per se. The modules with their frames and flaps are then attached on the soft profile with insert as described.

Layers a), b) and c) may also be instead thin film photovoltaic cells deposited on glass, like a-Si cells.

The encapsulating layers are wider and longer than the cells in both cases, to reduce oxygen and water ingress to the cells along the edges. Sealing beads may be further used to obtain a maximal protection against humidity and oxygen allowing the use of oxygen and moisture sensitive cells, being understood that the adhesive layers include also barrier films.

The lamination on the rigid (coated) metal or glass reinforced plastic sheet may be done according to any known suitable method and with appropriate adhesives, but preferably during the vacuum lamination/encapsulation process of the cells. The metal or plastic sheet may be equipped at this stage with e.g. rigidifying profiles or cup-shape pieces at the rear of the sheet (to avoid excessive deflection when installed on the roof).

More details about light weight flexible photovoltaic cells and modules (and the process of laminating them in e.g. a vacuum laminator) can be found in numerous patents and patent applications like EP 0769 818 A2, WO 2006/089044, WO 98/13882, and in the patents from the following companies: Konarka (Organic photovoltaic and Graetzel cells and modules), VHF—Flexcell (a-Si:H cells and modules), Helianthos/AKZO NOBEL (a-Si:H cells and modules), Powerfilm (Iowa Thin Film) (a-Si:H cells and modules), Canon, (a-Si:H cells and modules), Fugi, (a-Si:H cells and modules), United Solar Ovonic, (a-Si:H and triple junction cells and modules).

Metal sheets suitable as rigid sheet for this invention may be typically:
  0.5 to 2 mm single sheet metal profile, as made from Al55/Zn45 type coated steel (Aluzinc, Galvalume, Galval, Zincalume), AZ185 with e.g. epoxy coating
  0.5 to 2 mm Aluminium sheets (possibly coated to further improve corrosion resistance in aggressive environments)
The metal sheet may be partly corrugated to improve its flexural rigidity. Coatings to improve the adhesion of the metal sheets with polymeric films may be PVC-Vac, PUR, Epoxy, Acrylic, etc. based coatings.

Rigid glass reinforced plastic sheets may be:
  Glass reinforced flame retarded PP, preferably corona treated and/or with a primer (e.g. chlorinated polyolefin),
  Flame retarded epoxy or unsaturated polyester glass fiber composites The color of the sheets is preferably white (IR reflecting) except if the sheet is used to heat water. In the latter case the sheet is preferably dark coloured.

Adequate glue for adhesion of the rigid metal or plastic sheet to the photovoltaic module (=layers a) to d)) is easily selected by the man skilled in the art. Acrylic/epoxy adhesives may be used to pre-coat the metal sheets.

The waterproofing membranes and composition of profiles used for this invention are known per se. Conventional sheets and compositions for sheets and profiles are useful and may consist of any material which is suitable for roofs. The material must be resistant to weathering and in particular to UV light (except when the material is fully protected by the metal or preferably glass reinforced sheets), be watertight and resistant to temperature variations.

Common materials are soft (modified) polyolefins (polyethylene, chlorinated polyethylene, polypropylene, ethylene propylene rubber, copolymers of ethylene and vinyl acetate and their mixtures, etc.), EPDM (ethylene propylene diene monomer), TPV (thermoplastic vulcanistes like Santoprene®), PIB (polyisobutylene), ECB (ethylene copolymer bitumen), plasticized PVC (phthalate plasticizer, polyadipates plasticizers, Elvaloy® types resin, PVC-grafted on EVA or polyacrylate, etc.), bitumen, and blends of two or more of these. The sheets and profiles may consist of several layers (obtained e.g. by coextrusion). For the layer to adhere to metallic inserts, functionalized polymers may be used containing in their back-bone and/or as side chains functionalities like maleic anhydrides and/or acrylic acids functionalities. Parts of profiles and/or sheets which are perforated may have a e.g. inner layer containing super-absorbing polymeric particulates, possibly at the nano-scale. When perforated, such e.g. inner-layer will seal the leakage.

The sheets are commonly reinforced with polyester scrim (typically 3*3, 1100 dTex) and/or glass fleece (typically 50 g/m$^2$) and may have a polyester backing to attach the sheet to the insulation panels. The sheets are preferably also fire resistant, either as a property of the material used or by addition of suitable fire retardants. The sheets further contain pigments and possibly UV light and thermal stabilizers and may be coated by protective varnishes or barrier coatings (against plasticizer migration . . . ).

The profiles have similar composition as the waterproofing membranes. They may have an upper part which is more rigid. For instance, if the base part is soft PVC (plasticized PVC (P-PVC)), the rigid part may be rigid U-PVC (with additives to increase its softening temperature and fibers to increase the pull-out value of the screws). On TPO profiles (e.g. based on Hifax CA 10 A), a glass reinforced PP (impact modified) may be used. Screws/clamps will be fastened in this upper part possibly along groves.

Expancel® from AKZO or other well known blowing agents may be used to produce a foam core for the profiles, if desired. e.g. PUR foam and/or mechanicals means may also be used in the field to seal the profiles.

Therefore, and as example, if the waterproofing membrane is a P-PVC waterproofing membrane, the profile will be based on P-PVC with possibly a coextruded upper layer of rigid PVC (glass reinforced, . . . ) optimized to increase the pull-out value of the screws/clamps.

Compared to the previous art, the invention offers the following advantages:
- Improved reaction to fire when the modules are attached on a metal sheet and therefore completely separated from the waterproofing membrane by this metallic fire barrier sheet, which further works as a heat sink and therefore greatly limits fire propagation.
- Possibility to achieve outstanding reaction to fire when layers d) contain enough halogenated flame retardant, allowing for the use of a thick protective transparent EVA adhesive layer b)
- No folds or creases into the module during installation.
- Low strain of the cells (including barriers layers) and interconnections during storms and other mechanical stresses
- The modules are difficult to steal as the modules can mechanically be fastened with special screws (anti-theft screws)
- There is ventilation under the module and therefore:
  - The temperature of the module in use is lower which means in principle a higher electricity production and certainly a higher durability.
  - Lower temperature of the waterproofing (WP) membrane which means lower need of electricity for air conditioning and better aging of the waterproofing membrane (protected part)
- The ventilation under the module can easily be closed to achieve when desired annealing of a-Si modules.
- Less risk that the modules will get submerged by water (3 cm above the WP membrane)
- Low risk of condensation and formation of vapor at elevated temperature under the modules (less corrosion of the contacts and less damage to the cells by elevated temperature vapor) due to the ventilation
- better encapsulation (protection against moisture and oxygen) of the cells (e.g. by metal and glass)
- No risk of formation of creases in use (high dimensional stability of the metal sheet and separation from the waterproofing membrane and moving insulation panels) and reduced risk of delamination between substrate and module or inside the modules (better aging resistance of the adhesive between metal sheet and module as no water vapor at high pressure may damage the adhesive)
- Higher durability of the photovoltaic modules as the surface temperature of the modules is reduced
- Possibility to fully cover (protect) large sections of the plastic roof with the photovoltaic module panels of this invention while keeping (enough) water vapor permeability
- Possibly lower cost of installation of the waterproofing membrane as the rigid metal or glass reinforced plastic sheet (with long screws or mechanical fasteners) may be used to attach the waterproofing membrane (perforated) to the roof surface in a rigid way. The waterproofing membrane may even be first fastened to the roof structure with parallel rows of mechanical fasteners (perforating the membrane) or with bars. These rows or bars are then covered by the profiles (instead of usual strips) and sealed by welding the flaps of the profiles to the waterproofing membrane. The PV modules (their substrate, secondary profiles, etc.) are then fastened to the profiles, without need of perforation of the waterproofing membrane.
- Lower risk to reach module and adhesive temperature in excess of 85° C., which is the critical temperature for self-adhesive glues and for many useful glues/adhesive films (e.g. Ethylene Acrylic Acid copolymers).
- Ease of installation and of control/replacement of cables and electrical connections
- Ease of installation of protective elements for cables, etc (it is possible to perforate with screws the rigid metal or plastic sheet, without perforation of the waterproofing membrane)
- Protection against weathering of cables and electrical connections (they may be attached under the photovoltaic panels)
- No development of micro-organisms (plasticizer extraction) thanks to the ventilation of the space between the waterproofing membrane and the modules No perforation of the roof required The profiles, at the roofing sheet side, are soft so no cracks will form due to dilatation of the profiles in the waterproofing membrane In case of a full plastic module, the lightning risk is reduced The building is kept cooler (less electricity consumption for air conditioning)

Possibility to use the space between the metallic base of the modules, the profiles and the insulated waterproofing membrane to install thermal solar water heating systems.

Possibility to attach all the modules together with anti-theft screws: theft of modules becomes very difficult.

Possibility to install curved metallic profiles along the edges of the area of the roof covered by modules: limitation of lightning risk and of theft.

The photovoltaic system remains light weight (<15 kg/m$^2$) compared to crystalline silicon modules with their mounting frames and/or the ski effect allows spreading the load on the roof surface.

BRIEF DESCRIPTION OF THE DRAWINGS

The invention will be illustrated further by reference to the attached drawings which are not meant to restrict the scope to the specific embodiments shown. Other combinations of the preferred features than those shown are also possible and advantageous. The drawings are showing.

DETAILED DESCRIPTION OF THE DRAWINGS

Figure 1A:
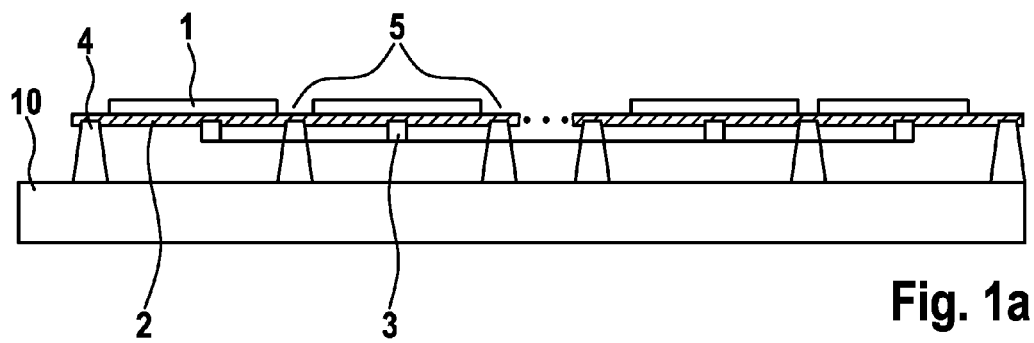
FIG. 1a a cross section through modules fixed according to the invention

FIG. 1a shows 2*2 photovoltaic modules 1 laminated on a rigid sheet 2. The modules may be of the well known type "Uni-Solar PVL 136" from Uni-Solar. Cheaper modules 1 may be used and e.g. directly laminated on the rigid sheet 2 during the lamination encapsulation process. The stack of layers, from top to bottom, can be:

A) ETFE or FEP (5, pref. 20 to 200 µm) from DuPont, surface treated to adhere to EVA B) EVA Vistasolar 486.10 from company Etimex (50, pref. 200 to 1500 µm), alternatively other transparent adhesive resilient film C) Cells (including electrodes and if required barrier layers) on PEN or PET or polyimide (pref. KAPTON®) (50 µm), with surface treatment to improve adhesion towards B and D D) EVA, possibly flame retarded or EEA (Primacor type), possibly flame retarded or PO with grafted maleic anhydride (Orevac type), possibly flame retarded, . . . (20 to 200 µm)

E) TPO (a VLDPE Plastomer Exact 0201 or FPP Hifax CA 10 A, etc.), possibly flame retarded (200 to 1500 µm). VLDPE stand for Very Low Density Polyethylene and FPP for Flexible Polypropylene.

F) An adhesive (copolymer with maleic anhydride, acrylic acid, hot melt PUR, etc), possibly flame retarded, G) 0.5 to 3 mm metal sheet (pref. Aluminum or steel, e.g. epoxy coated and surface activated by e.g. $N_2/CO_2$ Corona treatment)—(2) on the picture, possibly partly corrugated or rigidified by transverse profiles (on the face looking to membrane 10), or possibly equipped with feet.

The layers A) to F) are designated 1 in FIG. 1a, layer G) is designated 2 in FIG. 1a. The layers D) to F) may be coextruded. Layers A) to F) may be laminated to G) in a (nearly) R2R process (with the required interruptions of cells in the length to seal the edges). The connections 3 (contacts/solders and electrical wires, . . . ) may, as shown, be done and run under the modules 1 (the rigid sheet 2 is cut through to make the solders with the wires, and to encapsulate them with state of the art resins like PA (e.g. PA from Henkel, Macromelt 6240), PUR, Epoxy, etc.). The connections and wiring 3 are protected from the sun and rain.

The waterproofing membrane 10 is generally mechanically attached (not shown) to the roof structure with mechanical fasteners in the overlap between waterproofing membranes or with a "bar" system. The profiles 4 are attached, preferably welded on the waterproofing membrane, possibly covering the mechanical fasteners rows or "bars".

The rigid sheet 2 is attached on profiles 4, e.g. with, pref. anti-theft, screws. Module free zones 5 or at least cell free zones, typically 2 to 6 cm, are foreseen for attaching by screws. The profiles 4 may be perpendicular or as shown parallel to the rigid sheet 2. A typical size for the rigid sheet 2 (aluminum, steel, composites . . . ) is 1*6 m$^2$. The waterproofing membrane is not perforated. If desired, the open edges may be partly closed with e.g. metallic profiles attached approximately perpendicular to the inserts to connect the inserts together (creating a rigidifying network structure). Big rigid modules (6 m length of steel) may damage the waterproofing membrane by dilatation-contraction when directly glued with strong adhesives. Soft (weak) adhesives avoiding that risk are prone to storm damages.

Figure 1B:
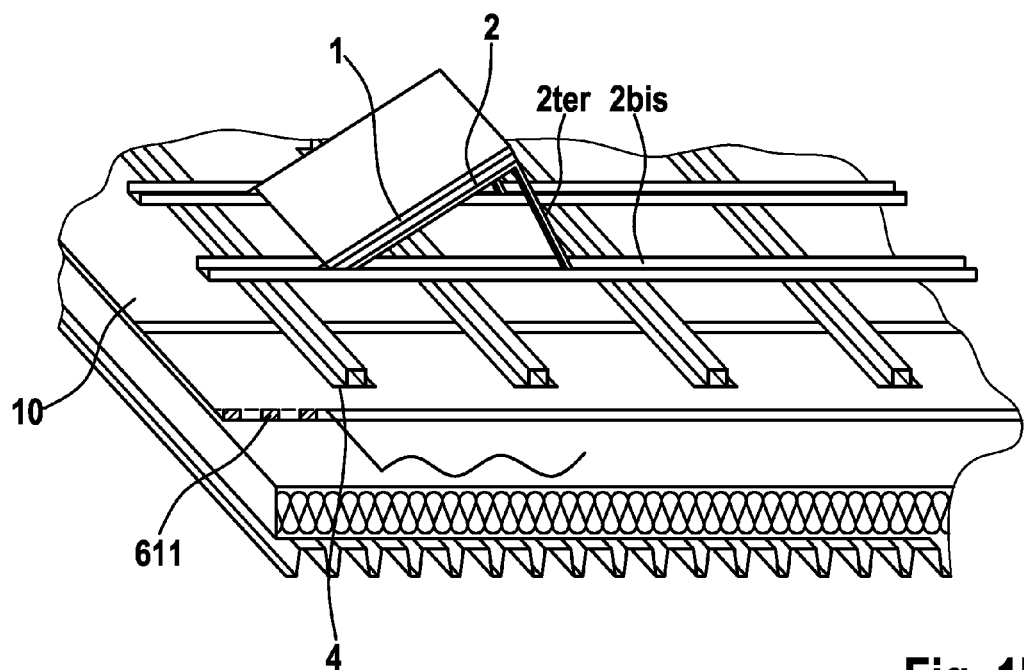
FIG. 1b a perspective view of the profile system with one solar element

FIG. 1b shows a photovoltaic module (1) comprising a rigid module with a typically 4 mm thick glass sheet as front sheet. The rigid metal (e.g. aluminum) frame is provided with rigid flaps (2 bis and 2 ter). Soft profiles (4) with metallic rigid insert (23—not shown) are welded onto the waterproofing sheet (10). Fixing means like stainless steel self-drilling screws (24—not shown) are used to fasten the rigid flaps (2bis) of the frame to the inserts (not shown) which are inside the soft profiles (4). Several modules (1) may be connected to the flaps (2 bis) in the factory and delivered flat on the roof. The inclination is obtained on the roof as shown in FIG. 1 with the flap (2 ter). The man skilled in the art will recognize that the advantage of modules with flaps (2 ter) is the possibility to modify the inclination of the modules towards the sun (1 axis sun tracking) by moving flaps 2ter (with motor and rod system) along profile (2bis) and to reduce the slope of the module, possibly to horizontal in case of heavy storms.

In an alternative approach, the element 2bis can also be installed as secondary profile, separately (U profile, rectangular profile, . . . in e.g. 2 mm thick aluminium; size of the rectangle=typically 8*4 cm$^2$). The module (1) is attached to the U or rectangular profile (2 bis) with a rigid element formed by a rigid triangle following the geometry of (2), (2*bis*) and (2 *ter*). Many other possibilities of mounting the module to the profile are available, as known by the man skilled in the art.

In the case of FIG. 1*b*, the waterproofing sheet (1) is fastened to the roof structure with classical mechanical fasteners (611) which are laid in the overlap between the rolls of waterproofing sheet (10).

One will recognize that the rigid metal frame with flaps (2, 2 *bis* and 2 *ter*) ensures the rigidity of the connection with the substrate of the roof. The wind up-lift forces are better spread and transmitted to the mechanical fasteners (611). It is therefore not required and also not preferred to add complementary ballast to the frame (2) and/or profiles (2*bis*) to hold the PV module (1) on the roof.

It is further preferred to weld the profiles 4 along or at least in parallel with the seams between rolls of waterproofing membrane 10 to better transmit the wind up-lift forces, e.g. to the fasteners 611.

It has to be recognized that the frame (2) may be installed (2*bis*) perpendicular to the profiles (4) with their insert, as shown on FIG. 1*b*, but also with another angle, if required to obtain the optimal orientation of the PV modules to the sun.

It has to be recognized that the profiles (4) with their insert may be installed, as shown on FIG. 1*b*, perpendicular (90° angle) to the seams between the several rolls of waterproofing sheets (10) but also with another angle, if required to obtain the optimal exposition of the PV modules to the sun.

The system of soft profiles (4) with insert (23) allows for a very strong but at the same time very light and soft connection between PV modules (1) (with their mounting and fixing accessories, frames (2) and flaps (2 *bis* and 2 *ter*)) and the waterproofing sheet (10). The system relies on mechanical fasteners (screws) and welding operation of soft plastic profiles (4) onto soft plastic sheets (10). The soft connection with the waterproofing sheet (10) avoids the risk of damage of the waterproofing sheet by direct connection to rigid elements which would contract and expand and would damage the waterproofing membrane. The rigidity of the connection (profiles 4 with insert 23 together with rigid frames (2) and flaps (2*bis*, 2 *ter*)) allows to install modules on the roof even with an ideal slope (>15°) thanks to the "ski effect" (spread of forces to achieve good tilting resistance when the PV modules catch wind from behind) and without the need of heavy weight (pavers) and interlocking the modules like in U.S. Pat. No. 5,505,788.

The inserts (23) may be connected to each other in their length, to increase the ski effect, with e.g. metallic connecting pieces allowing free dilatation of the separate connected inserts in their length. Such connected inserts (23) are also considered as inserts (23).

The secondary profiles (2 *bis*) may be connected to each other in their length, to increase the ski effect, with e.g. metallic connecting pieces allowing free dilatation of the separate connected profiles in their length. Such connected profiles (2 *bis*) are also considered as profiles (2*bis*).

The inserts (23) and/or profiles (2*bis*) may be connected to each other, corresponding to a length of the area in which the photovoltaic modules (1) are to be installed.

So the proposed system achieves the highly desirable combination of apparently contradictory properties of strength, light weight and softness.

Figure 1C:
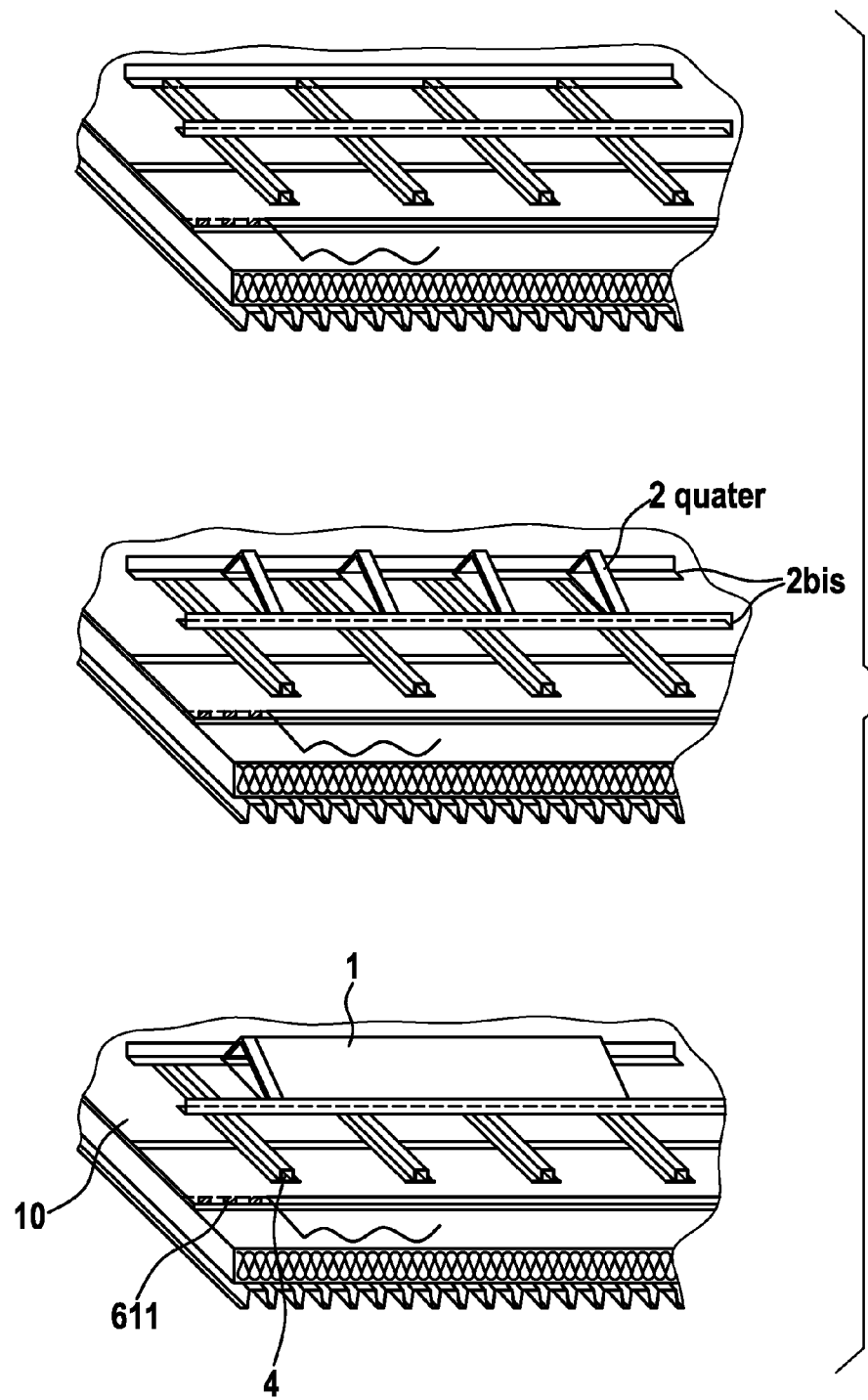
FIG. 1c several steps of installation of a variant of the profile system of FIG. 1b FIG. 1d installation of a solar module with an alternate profile system FIG. 1e a cross section of modules with flaps allowing for partial sun tracking (1 axis) and possibility to bring the modules in horizontal position in case of storm.

FIG. 1*c* shows a variation of FIG. 1*b*, where L profiles 2 *bis* are attached on the soft profile 4, with insert (not shown). Triangles 2 quater are further attached on the L profiles 2 *bis* with adequate screws. The modules 1 are mounted with usual clips/fasteners on the triangle 2 quater.

Figure 1D:
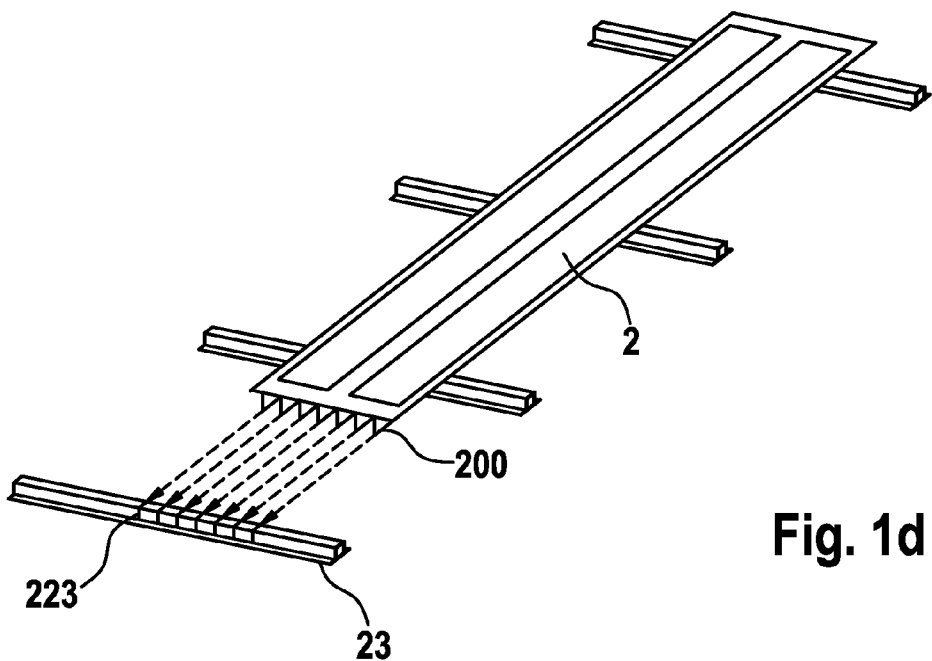

FIG. 1*d* shows a substrate 2 with ribs 200 to improve the flexural modulus. FIG. 1*d* show an insert 23 with cuts 223 which is matching the ribs 200. The soft profile is cut at the level of the cuts in the insert.

Figure 1E:
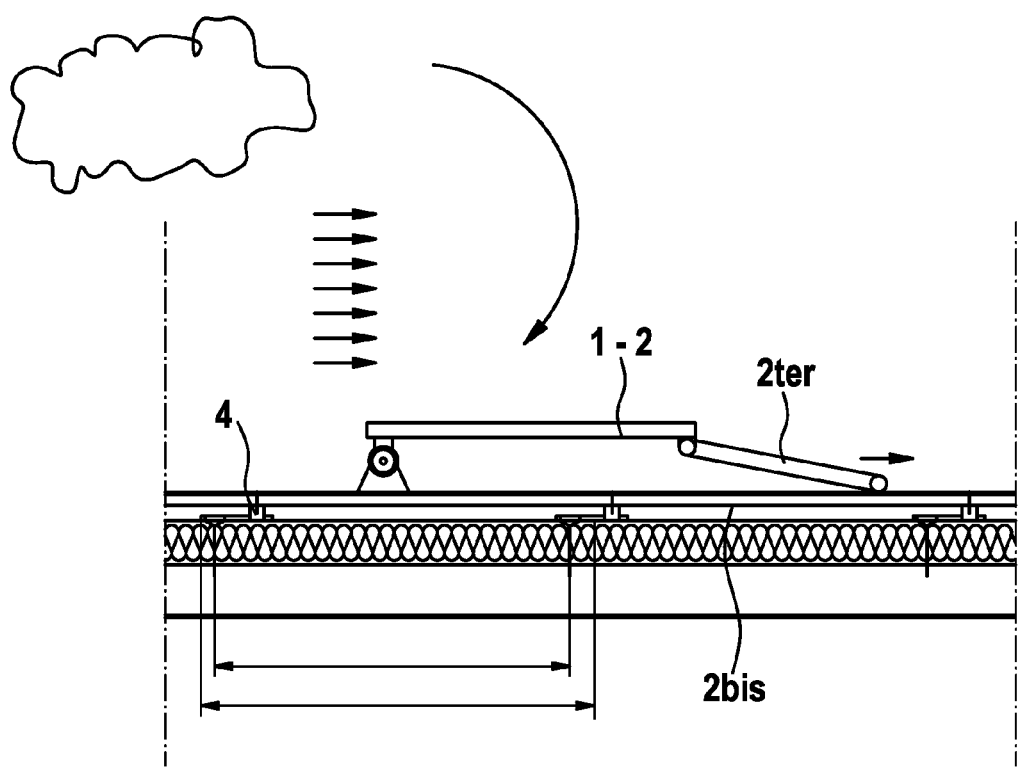

FIG. 1*e* shows a cross section of module (1) with flaps (2*ter*) allowing for partial sun tracking (1 axis) and as illustrated the possibility to bring the module (1) in horizontal position in case of storm. This system is in particular useful when the waterproofing membrane is attached to the roof structure by glues (membrane attached to the roof with an adhered system instead of mechanically attached system). Adhered systems are indeed not always able to transmit to the roof structure the forces applied on the profiles, e.g., when the PV modules get wind from behind. Deflectors may be attached to the profiles to improve wind stability, as will be recognized by the man skilled in the art.

Figure 2A:
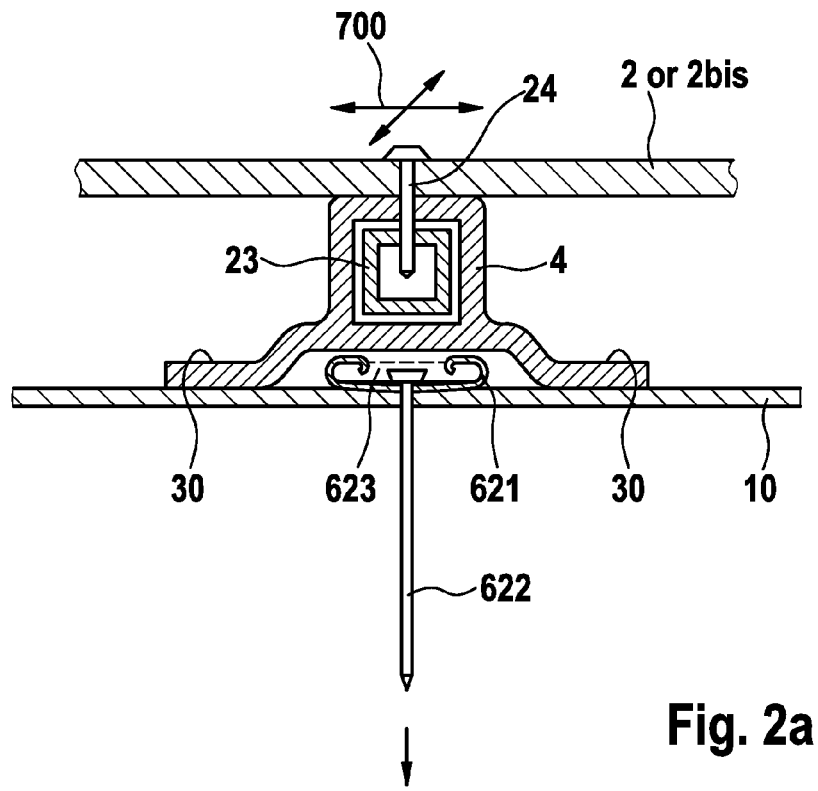
FIG. 2a a cross section through a soft profile with rigid insert

FIG. 2*a* shows a cross-section of a first soft profile 4 with flaps 30, containing a metallic insert 23 which may be used for this invention. First the waterproofing membrane is laid on the roof and attached to the roof structure with metallic bars 621 and screws 622 (as shown on FIG. 2*a*) or with classical fasteners (611; FIG. 1*b*). The space 623 may be filled with a protective material to limit wearing effects on profile 4. The profile 4 (typical sizes: wall thickness=3 mm; internal width=3.3 cm; internal height=3.3 cm) with its insert 23 (e.g. a rectangular aluminium insert; typical sizes: wall thickness=2 mm; external width=2.0 cm; external height=2.5 cm) is welded with hot air along both flaps 30 (typical total width=12 à 20 cm) to the waterproofing membrane. The ends of the flaps, which may be longer (typically 2*5 cm) than the profile, are also welded on the waterproofing membrane to seal the bar 623 completely. A typical length of profile, insert and bar is 3 m or 6 m. Further profiles are welded on the membrane in parallel. The distance between parallel soft profiles will typically be between 0.5 m and 3 m. With a low distance of e.g. 0.5 m, the module substrate or frame don't need to be attached on each profiles. Profiles may be installed according to FIG. 2*f*, when it is only required to provide a support function to the module substrates or frames. On top of the profile 4, one will attach with screw 24 the rigid substrate 2 or secondary profiles (2 *bis*) or frame 2 with flaps (2 *bis*). The 2 directions "double arrow" 700 indicates the freedom of movement in the lateral direction, and in the length of the profile. The arrow shows that the system can cope with dilatation-contraction of substrate and frames: a 3 m long Aluminium or 6 m long Steel substrate 2 (or secondary profile 2*bis*) will typically expand about 7 mm between a typical minimal night winter temperature of −15° C. and a typical maximum summer day operating temperature of 85° C. (module and substrate temperature). The proposed system can easily cope with such dilatation-contractions without damage to the waterproofing membrane and the modules (internal tensions). In many cases, the bars 623 and screws 622 are omitted. The soft profiles are simply welded, parallel to each other, on the waterproofing membrane 10 which is already fastened to the roof structure with classical fasteners as shown on FIG. 1*b* (611 in the overlap between membranes). This method is used e.g. for already installed waterproofing membranes. The thick sole (3 mm) of the profile protect the waterproofing membrane 10 (typically 1.5 mm) against the wearing action of the insert 23. It is also possible to attach the waterproofing membrane to the roof structure with long screws 24 which perforate the profiles, inserts and membrane. This is useful when the roof has a slope. The profiles 4 are sealed to the membrane and at the top of the slope to avoid water ingress.

Figure 2B:
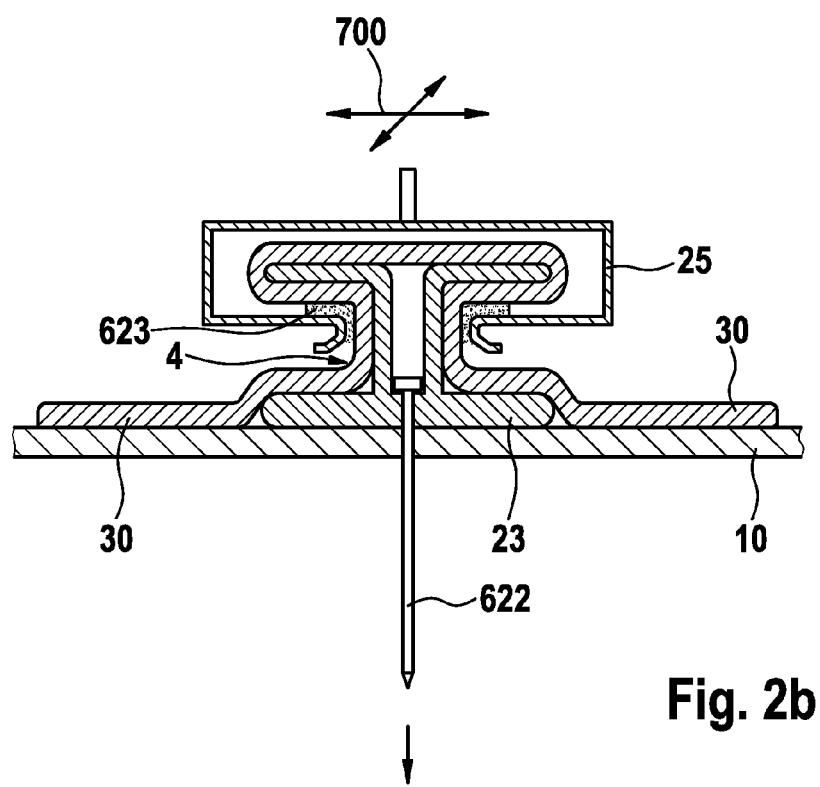
FIG. 2b a cross section through an alternate profile

FIG. 2b shows a variation with a clip system: The insert 23 is installed on the waterproofing membrane 10 and is used to mechanically attach the membrane to the roof structure with screws 622. A strip of waterproofing membrane wraps the insert 23 and forms a profile 4 around the insert 23. The flaps 30 are welded onto the waterproofing membrane 10. A clip 25 is attached (slip along) on the profile 4. A protection 623 against the wearing action of the clips may be foreseen.

Figure 2C:
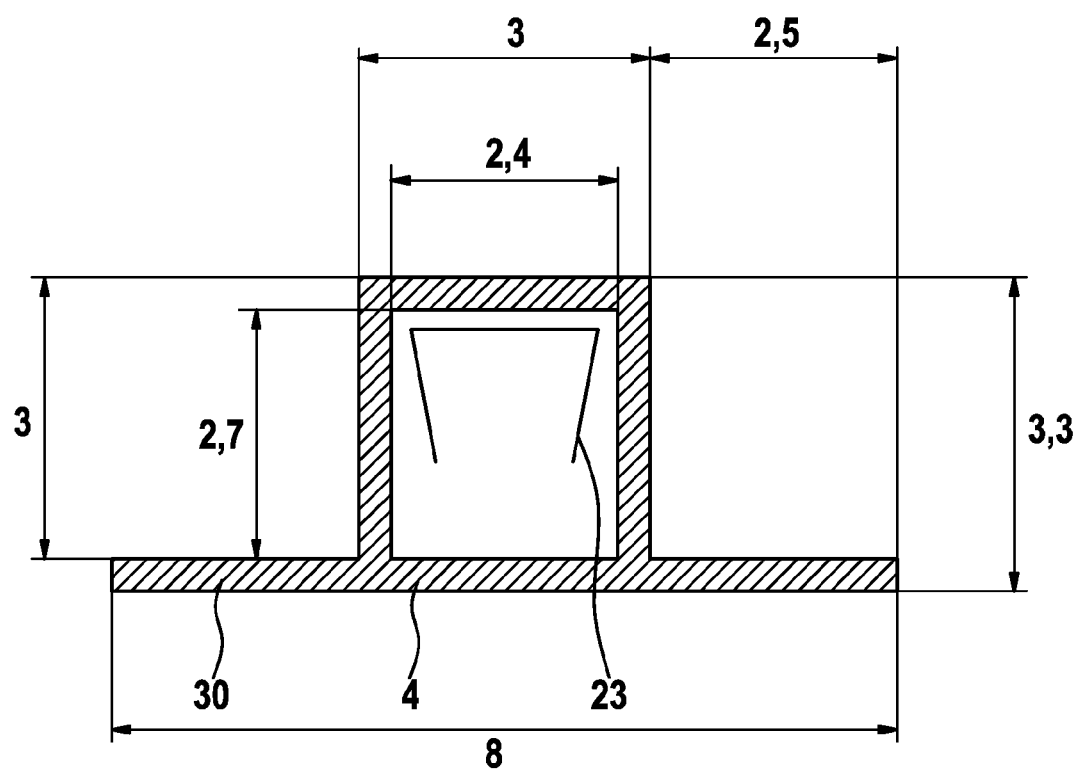
FIG. 2c a cross section through a weldable hollow profile with rigid insert

FIG. 2c shows a cross section of a simple hollow profile with useful dimensions, all sizes are in cm. The hollow profile is equipped with an insert (like e.g a U-shaped aluminum profile (23)) and is soft. The man skilled in the art will easily recognize the freedom of dilatation-contraction of e.g. a substrate (2) attached to profile (4) and insert (23), in the direction perpendicular to the profile. On FIG. 2c, the insert has indeed a freedom of movement in the direction perpendicular to the profile (4) of at least 1 cm.

Figure 2D:
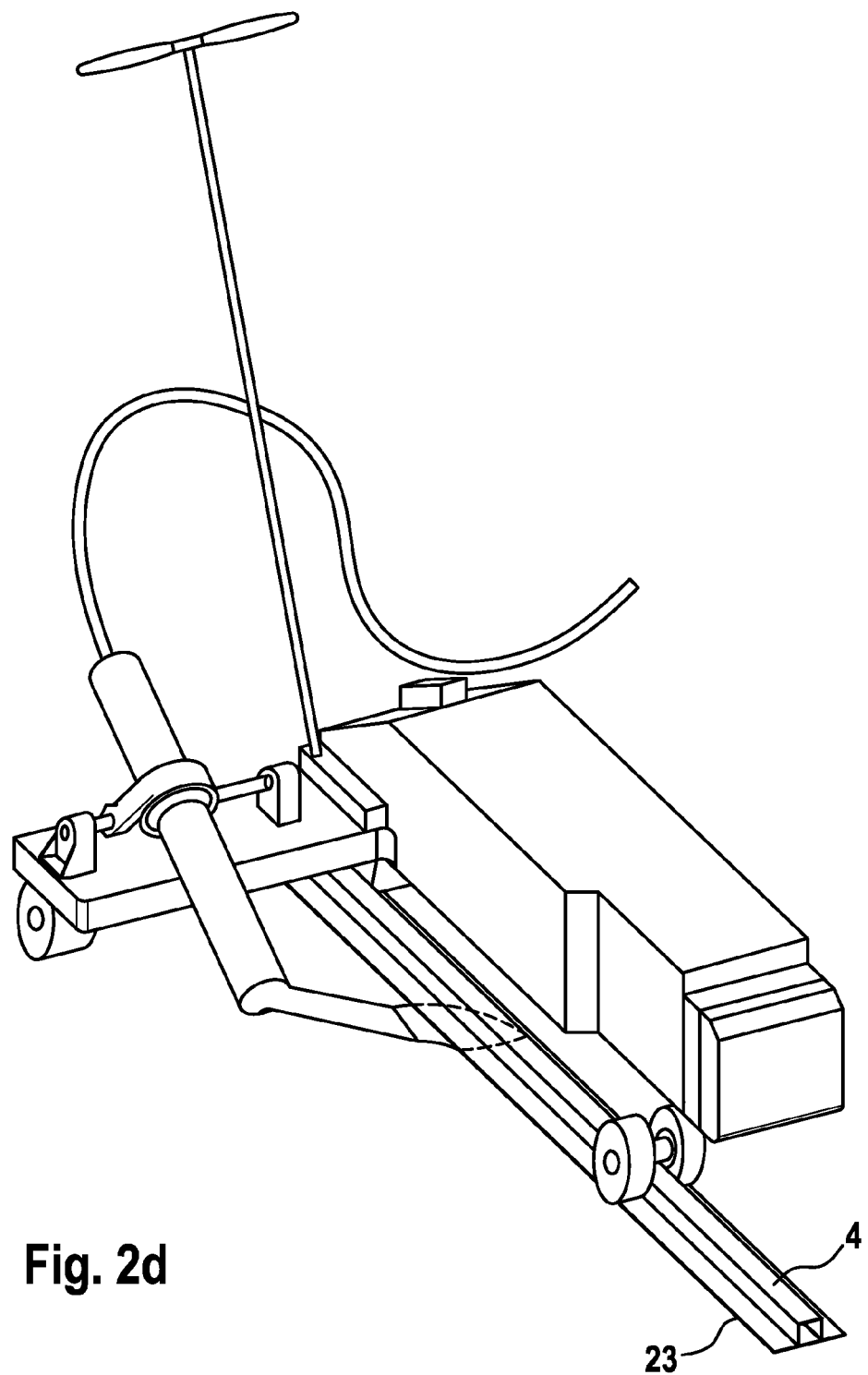
FIG. 2d a schematic view of the welding of a profile to a roofing sheet

FIG. 2d shows an adapted welding machine (hot air welding), welding a continuous profile 4 of this invention. The wheel is designed to push on (press) both flaps 30 of the profile 4 onto the underlaying membrane 10 (not shown) during the welding operation. In this case the profiles 4 are attached to the membrane 10 by welding the flaps 30. The flaps can be welded independently (2 steps) or in one step, depending on the design of the welding machine.

Figure 2E:
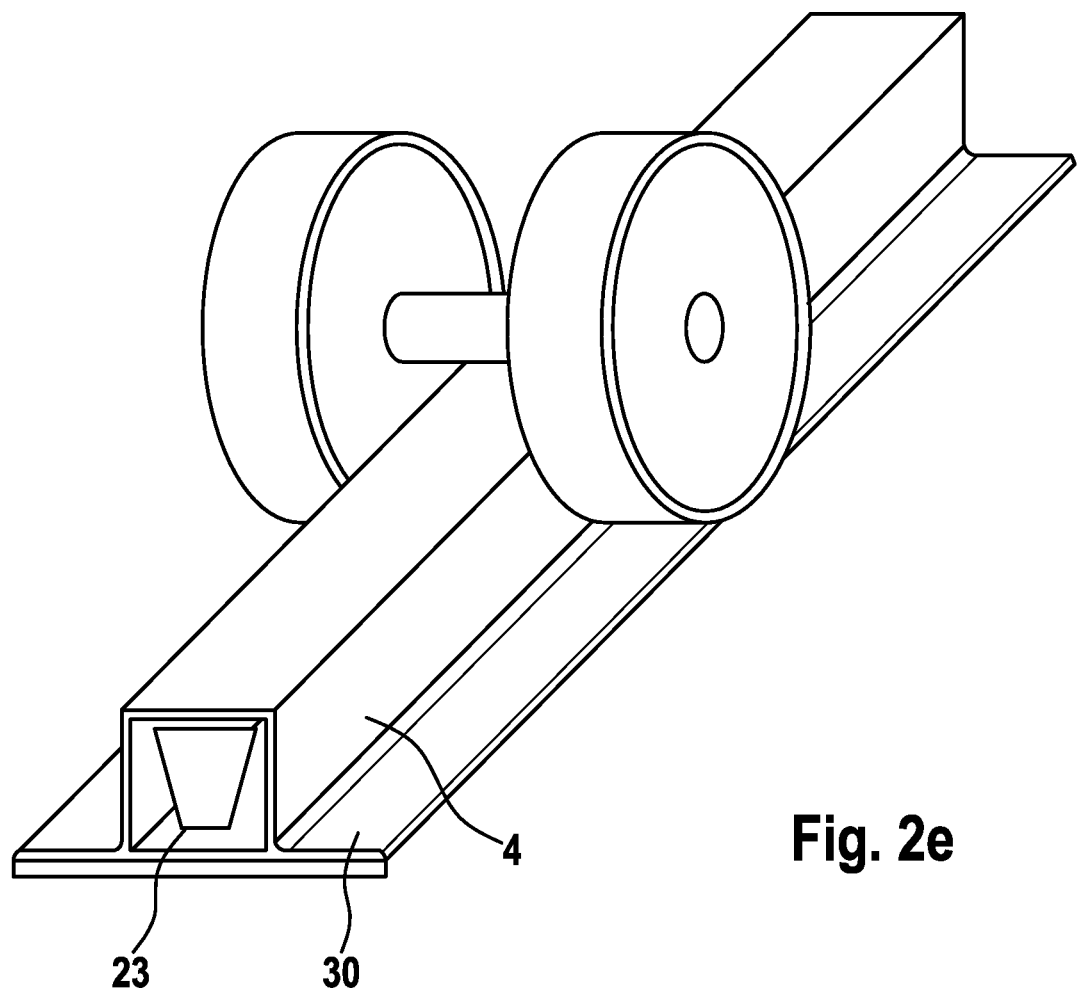
FIG. 2e an enlarged section of the welding equipment

FIG. 2e shows a detailed view of the wheel adapted to fit the profile 4.

Figure 2F:
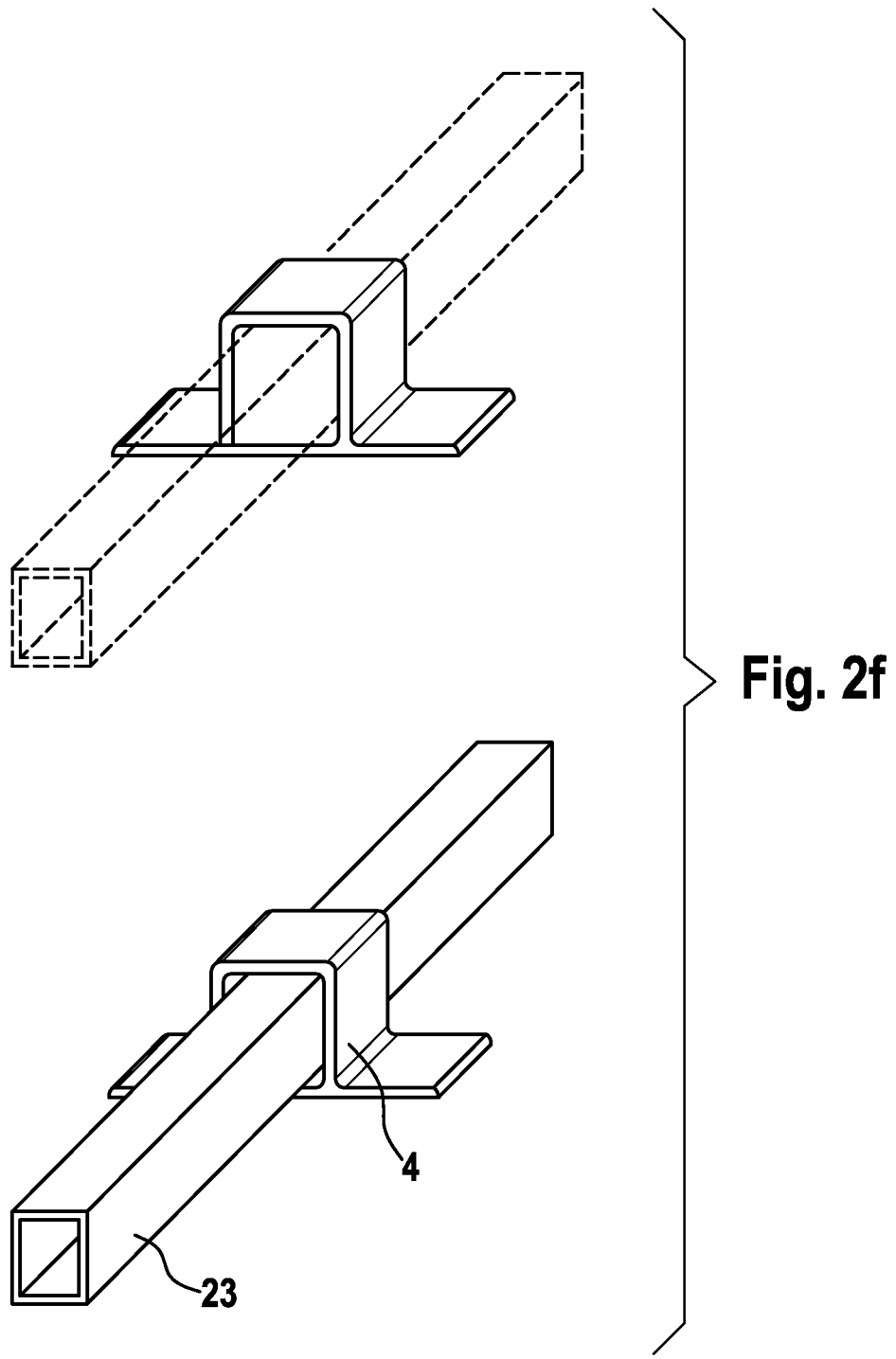
FIG. 2f an interrupted profile

FIG. 2f shows a view of an insert 23 and a short profile 4 attaching the insert 23 on a waterproofing membrane. In this configuration the insert is mainly used to support the rigid substrate 2.

Figure 3:
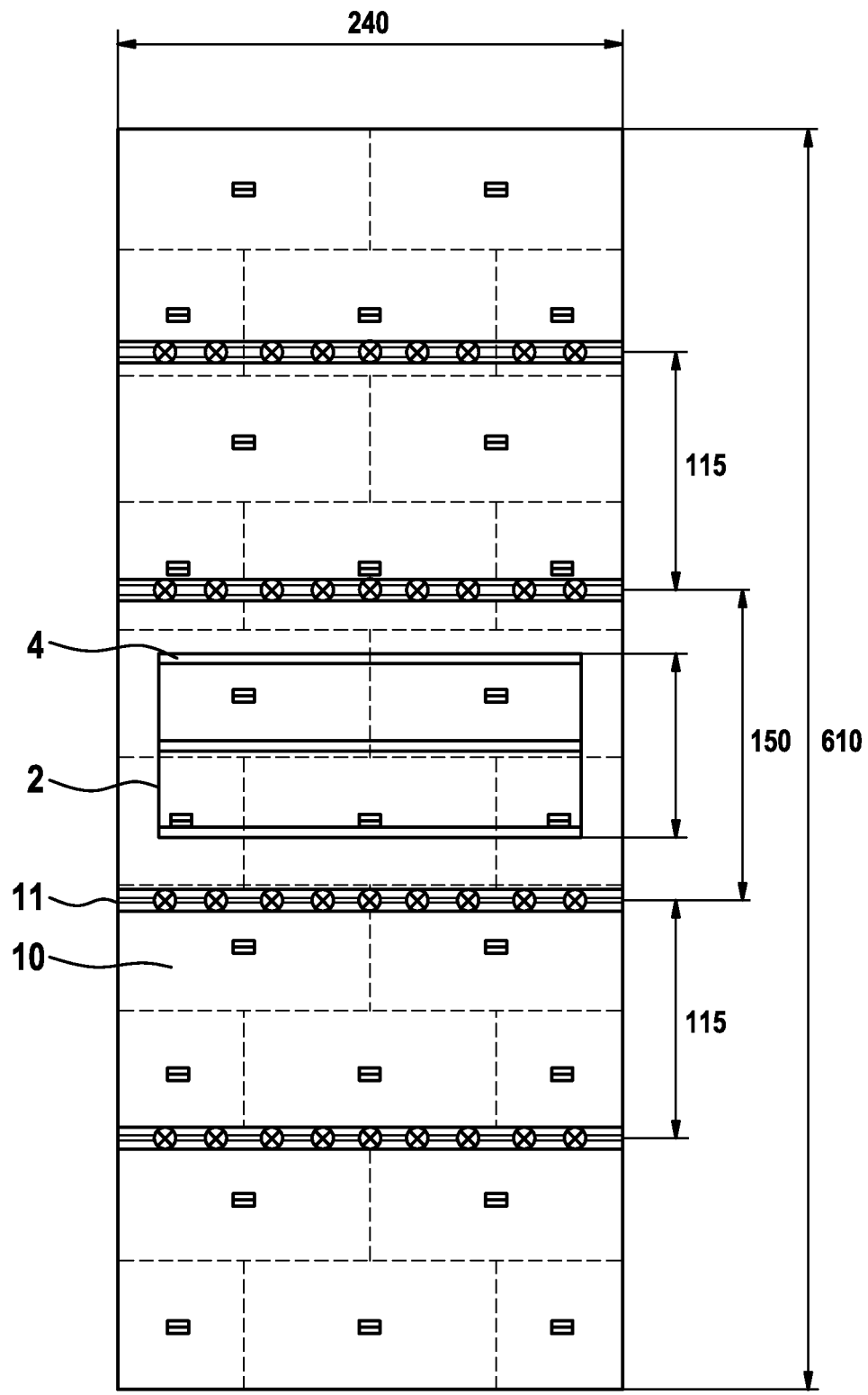
FIG. 3 a drawing of a wind up-lift test.

FIG. 3 shows a drawing of a wind up-lift test (wind channel of 6.1 m*2.4 m) performed according to ETAG 006. On a corrugated metal sheet with insulation panels (mechanically attached to the corrugated metal sheet), one installs the waterproofing membrane 10 (mechanically attached) as known by the man skilled in the art. Profiles 4 (only 3 are shown) are welded on the waterproofing membrane 10. The metal substrate 2 is screwed on the profiles 4. In function of the expected wind up-lift forces, the membrane may also be attached to the roof by gluing, e.g. PUR glues. The membrane is in this case equipped with a polyester backing fleece. Deflectors may be attached to the profiles to improve wind stability, as will be recognized by the man skilled in the art.

The installation methods (profiles, substrate, frames) may also advantageously be used in other combinations than the ones described in detail.

EMBODIMENTS

Embodiment 1.1

Use of Cheap Modules

The invention is of special benefit for cheap modules because of the improved installation safety, the excellent wind resistance and the increased durability and fire safety. For demonstrating the benefits two photovoltaic cells (2*0.4 m*5*4 m) are produced (and transferred) onto two plastic films (PEN), e.g. as described in WO 98/13882. The PEN film is called the (plastic) cell substrate. The two PEN films (0.4 m*5.4 m), with their photovoltaic active layers, are encapsulated in a laminator according to a procedure well known in the art. The PEN films are laid in parallel in the laminator with 5 cm between them. The encapsulating layers are 5 cm wider and longer at each edge than the two PEN films and cells. These layers have therefore a length of 5.5 m and a width of 0.95 m (0.05 m+0.4 m+0.05 m+0.4 m+0.05 m). The metal plate has also a size of 0.95 m*5.5 m and may be slightly corrugated in the zones without PEN films (without cell) or provided with small ribs. The screws are drilled into the plate in the 5 cm cell free zones and to the profiles with insert as shown on FIG. 1a (5 cm cell free zones (5)).

The encapsulated module 1 produced by well known lamination methods, e.g. according to EP 0769818 A2 comprises the following stack of layers:
a) An ETFE film 55 μm from DuPont (with surface treatment to adhere to EVA)
b) A stack of two EVA Vistasolar 486.10 films (thickness+/− 460 μm)
c) A 50 μm PEN film, supporting the active layers (e.g. TCO/pin/back electrode/adhesion layer/adhesive to PEN)
d) A coextruded EAA/VLDPE/EAA film (containing pigments and migrating stabilizers like HALS and UV absorbers compatible with layer b); total thickness around 700 μm. Reactive additives like standard HALS, like Tinuvin 770®, are added during the coextrusion step to the VLDPE layer only, and will be added to the EAA layers by migration during the lamination step.
e) A 1 mm Aluminium plate, if required coated as known per se to further improve corrosion/chemical resistance.

Electrical connections are done as known per se. In order to improve adhesion between layers and improve barriers properties, as will be recognized by the person skilled in the art, the several layers may be treated by several surface techniques: Corona, Flame treatment, Atmospheric plasma activation, Atmospheric of low pressure plasma deposition (aerosol assisted, . . . ) and/or polymerization, Sputtering (Aluminium, . . . ). Suppliers: Plato Plasma Technology and surface, Vito, AcXys, Dow Corning Plasma Solution, AS Coating Star atmospheric plasma, Plasmatreat, . . . . The techniques may be combined.

In field testing: The modules 1, but without the photovoltaic active layer, are installed at Sevilla, Spain, in accordance with this invention (FIGS. 1a, 2c and 3) on a waterproofing membrane (10) equipped with 3 profiles (4). The substrate 2 is attached to the profiles and inserts with stainless steel screws (1 per 25 cm). Self-drilling fastener (24) from austenitic stainless steel with a hardened carbon steel drill point, with EPDM vulcanised sealing washers (diameter: 6.3 mm; length: 25 mm; diameter sealing washer: 16 mm; material: A2 grade austenitic stainless steel) are used. The distance between the waterproofing membrane (10) and the metal plate (2) allowing for ventilation is 3.3 cm. It is expected that the stabilized production of electricity of the photovoltaic module will be nearly not affected by storms, humidity, heat, thermal cycli, . . . thanks to the low deformability (high E modulus) of the rigid metal substrate 2, its barrier and cooling effect and the capability of the system to cope with thermal expansion and contraction cycli. The maximum temperature which is reached inside the module with an ambient air temperature of 45° C. is less than 80° C. (measured at the layer d). This allows with high safety margin the use of tie-layer on base of EAA like Primacor 1321 or even 1410, as will be recognized by the man skilled in the art on base of the following data's:

TABLE

| Primacor | 1321 | 1410 |
|---|---|---|
| Tm (DSC ° C.) | 101 | 96 |
| Vicat (° C.) | 90 | 81 |
| Comonomer (%) | 6.5 | 9.7 |

According to the table, it is required not to exceed 90° C., preferably not 85° C.

The wind up-lift resistance of the system is tested according to ETAg 006. As shown on FIG. 3, a 1.2 mm Alkorplan F® 35176 waterproofing membrane (10) is mechanically fastened as well known in the art, on a steeldeck "106/250/3" (0.75 mm thick and 106 mm high) with Etanco EHB DF fasteners (diameter=0.48 mm-120 mm long) and Etanco 40*82 mm² plates. The 100 mm thick Rockwool Taurox insulation panels are fastened with the same fasteners. Three profiles (4) as shown in FIG. 2c (plasticized PVC—same composition as the waterproofing sheet) are welded on the waterproofing sheet (10) and equipped internally with a nearly rectangular U aluminum profile (2 mm thick) as shown on FIG. 2c. The module 1 and its substrate 2 (see 2 on FIG. 3), but with a length of 2 m and without the active layer, is attached on the profiles (4) with stainless steel screws (1 screw/25 cm). The wind up-lift test is performed according ETAG 006 up to 4500 Pa underpressure ($Q_{100\%}$). The waterproofing membrane, substrate 2 and simulated modules are not visually damaged (no significant strain of the PEN film).

Modules 1 (on their metallic substrate) without their photoactive layers are tested for external fire performances according to ENV 1187/1. The modules 1 are mounted on profiles as defined by the invention. These modules pass the ENV 1187/1 requirement at 15° and 45°. The quality of the waterproofing membrane and insulating substrate is not critical as the metal sheet acts as fire barrier.

Comparison 1.2

Production of Modules 2 installed according to previous art: DE 298 24 045 U1:
3 Unisolar PVL 136 modules are laminated in parallel in a membrane press with an EVA Vistasolar 486.10 film of +/−460 μm onto a 1.2 mm PVC-Elvaloy 742 sheet (PVC K71: 100 phr; Elvaloy 742®: 85 phr; DiDP: 10 phr; Ca/Zn stabilizer and lubricants: 5 phr; Talcum: 10 phr; TiO2 Kronos 2220: 10 phr). The PVC-Elvaloy 742® sheet is 10 cm longer (5 cm at each end) and is wider than the Uni-solar modules. At the side of the mechanical fasteners, the PVC-Elvaloy 742® sheet is 20 cm wider, and 15 cm at the other side. Electrical connections are done as known per se.

In field testing (Spain—Sevilla): The modules 2 are installed in accordance with DE 29824045 U1, with mechanical fasteners (see embodiment 1.1: installation similar as the installation of the 1.2 mm Alkorplan F® 35176 waterproofing membrane on Rockwool Taurox insulation board). The photovoltaic membranes (modules 2) are first stored one night on the field (minimum temperature=near 0° C.). The photovoltaic roofing membranes are then mechanically fastened under windy conditions at one side of the photovoltaic membrane and then welded together at their overlaps. It appears very difficult to install the membranes without formation of creases.

Compared to the modules 1, mounted according to embodiment 1.1, the maximum achieved temperature inside the Uni-Solar module is now above 85° C. The modules show internal tension (differential dilatation between waterproofing membrane and metallic substrate of the cells).

For many types of construction, condensation will occur under the waterproofing membrane and water vapor will migrate through the waterproofing sheet to affect the PV modules (damages under the metallic cell substrate). To assess the effect of humidity on the Uni-solar PV modules, the rear face of the PV membrane is submitted to water at 80° C. during 6 weeks. Internal delamination occurs within the Uni-Solar module, due to water vapor migration, which is blocked by the metal foil. It is estimated that a dark waterproofing membrane, installed during a time span of 20 years on insulation boards, will be submitted to a thermal stress equivalent to 10 months at 80° C. In case of humid conditions, a resistance of 6 weeks water at 80° C. seems not enough.

Comparison 1.3

The modules 1 without metallic substrate are directly laminated on top of a polyester reinforced TPO membrane (VLDPE based) containing classical mineral flame retardants (30% Al(OH3)) and installed on mineral wool insulation boards like in comparison 1.2.

This roof structure fails in the external performance fire test ENV 1187/1 (15° and 45°).

In the wind up-lift resistance test according to ETAg 006, the "photovoltaic membrane" (installed width of the membrane=1.5 m) is visually deformed at 3000 Pa with risk of damage to the cells.

Embodiment 2

Benefit for Uni-Solar PVL 136 modules

Two peel and stick Uni-Solar PVL 136 modules are laminated on a 1 mm AluZink® metal sheet PVDF pre-painted with pressing rolls and installed on profiles. No water from under the modules migrates towards the modules to affect them (hydrolysis reaction). Module temperature is reduced by at least 5° C. compared to the situation of comparative embodiment 1.2.

Further, it is well known that a higher temperature during exposition to weathering negatively affects the durability. Therefore, it is expected that the durability of a photovoltaic module (photovoltaic membrane) directly installed onto an insulation panel will be lower than of a photovoltaic module glued on a ventilated metallic sheet as in this invention. The literature demonstrates surprisingly high influence. In outdoor durability of PVC-Plastisols—Journal of Coatings Technology Vol 61, N° 779, December 1989, G. Inge Bäck reports a 60% increase of durability of uninsulated panels compared to insulated panels. The UV-aging durability limiting factor of the Uni-Solar PVL 136 modules (like for the modules 1.1 and 1.2) is that the EVA upper adhesive (layer b) gets brown during aging and looses transparency. At the end, the ETFE will delaminate from the degraded EVA layer leading to total module failure. As the mechanism of degradation of PVC (formation of conjugated double bonds) and of EVA are relatively close, it should be reasonably expected that the lower temperature of modules achieved thanks to this invention means at least a 20% higher durability. WO 99/27588 describes the impact of aging temperature on the browning of EVA films. While the evolution of color of the EVA films is hardly or not observed at 44° C., it is very marked at 85° C.

Embodiment 3

Benefit of the Invention for Modules Mounted on Frames

A Trina Solar Module 170 is mounted like shown on FIG. 1b (tilt angle=30°): A 1.2 mm thick, 1.6 m width Alkorplan F® 35176 waterproofing membrane (10) is first mechanically fastened (611) and welded in overlap as well known in the art, on a steeldeck "106/250/3" (0.75 mm thick and 106 mm high) with Etanco EHB DF fasteners (diameter=0.48 mm-120 mm long) and Etanco 40*82 mm²" plates. The 100 mm thick Rockwool Taurox insulation panels are fastened with the same fasteners. Three soft profiles 4 (see FIG. 2c) with inserts 23 (2 mm thick aluminium rectangle inserts–2 cm width*2.4 cm height) are then welded in parallel on the waterproofing membrane 10 along the seams between the waterproofing membrane rolls (distance between parallel soft profiles 4=1.5 m).

Two 2 mm thick 3.5 m long Aluminium (AW 6060) U profiles 2bis (base=9 cm; height=4 cm) are then attached with screws perpendicular to the 3 profiles 4 and inserts 23. The distance between the U profiles is the length of the PV module to be installed. Two triangle aluminium elements obtained by sawing, folding and welding a similar U profile as 2bis (difference=narrower base of +/−8.5 cm instead of 9 cm) are then centered and screwed onto the 2 profiles 2 bis (see FIG. 1b). The Trina Solar module 170 is mounted and secured on the triangle (tilt angle=30°) with classical fasteners for mounting PV modules.

The construction is submitted, in a subsonic wind tunnel, to a wind of 200 km/hour during 30 minutes (wind from behind the module). No damage is observed. The limiting factor was the deformation of the PV module itself. The system can cope with dilatation and contraction cycli of the U profiles.

The invention claimed is:

1. Photovoltaic module arranged in layers from top or sky face (a) to bottom or roof face (e) comprising:
    (a) a transparent front sheet,
    (b) a transparent adhesive layer,
    (c) a plastic or metallic film/foil which carries an active layer,
    (d) a back layer comprising an adhesive layer, and
    (e) a lower metal foil or rigid plastic sheet,
        wherein (d) comprises a coextruded layer comprising a tie layer/TPO/tie layer structure.

2. Photovoltaic module according to claim 1, wherein the coextruded layer comprises a tie layer comprising polyolefin copolymers with acrylic acid (EAA) or polyolefins grafted with one or more of maleic anhydride, epoxy glues, and PUR glues.

3. Photovoltaic module according to claim 1, wherein (e) is selected from the group consisting of PP, Polyester, Epoxy films, and glass reinforced PP.

4. Photovoltaic module according to claim 2, wherein (e) is selected from the group consisting of PP, Polyester, Epoxy films, and glass reinforced PP.

5. Photovoltaic module according to claim 1, wherein (a) comprises (i) a 50 to 200 µm fluoropolymer film of ETFE, FEP, or PVDF/acrylic, (ii) a stabilizer, and (iii) a long lasting UV absorber.

6. Photovoltaic module according to claim 5, wherein the fluoropolymer film is surface treated to improve adhesion to (b).

7. Photovoltaic module according to claim 1, wherein (b) is selected from the group consisting of EVA or ionomers with a total thickness from 100 to 1500 µm and layers which are flexible and impact resistant.

8. Photovoltaic module arranged in layers from top or sky face (a) to bottom or roof face (e) comprising:
    (a) a transparent tempered glass,
    (b) a transparent adhesive layer,
    (c) a rigid silicon cell or a plastic or metallic foil,
    (d) a back layer comprising an adhesive layer and a dielectric film, and
    (e) a layer selected from the group consisting of (i) a lower metal sheet, (ii) a glass with frame, (iii) a rigid plastic sheet, and (iv) a metal frame with classical backsheet,
        wherein the plastic or metallic foil carries an active layer arranged above (c), and
        wherein the dielectric film comprises PET or PA.

9. Photovoltaic module according to claim 8, wherein (a) is 4 mm thick.

10. Photovoltaic module according to claim 8, wherein (b) is selected from the group consisting of EVA or ionomers with a total thickness from 200 to 1500 µm and layers which are flexible and impact resistant.

11. Photovoltaic module according to claim 8, wherein (e) is selected from the group consisting of PP, Polyester, Epoxy films, and glass reinforced PP.

12. Photovoltaic module according to claim 10, wherein (e) is selected from the group consisting of PP, Polyester, Epoxy films, and glass reinforced PP.

13. Photovoltaic module according to claim 8, wherein (e) comprises a Tedlar/aluminium/PET sheet.

14. Photovoltaic module according to claim 10, wherein (e) comprises a Tedlar/aluminium/PET sheet.

15. Photovoltaic module according to claim 8, wherein (d) is selected from the group consisting of (i) EVA films or hot-melts, (ii) tie layers comprising olefin copolymers with acrylic acid (EAA), and (iii) polyolefins grafted with one or more of maleic anhydride, epoxy glues, and PUR glues.

16. Photovoltaic module according to claim 10, wherein (d) is selected from the group consisting of (i) EVA films or hot-melts, (ii) tie layers comprising olefin copolymers with acrylic acid (EAA), and (iii) polyolefins grafted with one or more of maleic anhydride, epoxy glues, and PUR glues.

17. Photovoltaic module arranged in layers from top or sky face (a) to bottom or roof face (c) comprising:
    (a) a thin film photovoltaic cell deposited on a transparent front sheet comprising glass,
    (b) a back layer comprising an adhesive layer and a dielectric film, and
    (c) a layer selected from the group consisting of (i) a lower metal sheet, (ii) a glass with frame, (iii) a rigid plastic sheet, and (iv) a metal frame with classical backsheet,
        wherein the dielectric film comprises PET or PA.

18. Photovoltaic module according to claim 17, wherein (b) is selected from the group consisting of (i) EVA films or hot-melts, (ii) tie layers comprising polyolefin copolymers with acrylic acid (EAA), and (iii) polyolefins grafted with one or more of maleic anhydride, epoxy glues, and PUR glues.

19. Photovoltaic module according to claim 17, wherein (c) is selected from the group consisting of PP, Polyester, Epoxy films, and glass reinforced PP.

20. Photovoltaic module according to claim 18, wherein (c) is selected from the group consisting of PP, Polyester, Epoxy films, and glass reinforced PP.

21. Photovoltaic module according to claim 17, wherein (c) comprises a Tedlar/aluminium/PET sheet.

22. Photovoltaic module according to claim 18, wherein (c) comprises a Tedlar/aluminium/PET sheet.

23. Photovoltaic module according to claim 17, wherein (a) is 4 mm thick.

24. Photovoltaic module according to claim 8, wherein (b) is selected from the group consisting of (i) EVA films or hot-melts, (ii) a coextruded tie layer/TPO/tie layer with tie layers comprising olefin copolymers with acrylic acid (EAA), and (iii) polyolefins grafted with one or more of maleic anhydride, epoxy glues, and PUR glues.

25. Photovoltaic module according to claim 10, wherein (b) is selected from the group consisting of (i) EVA films or hot-melts, (ii) a coextruded tie layer/TPO/tie layer with tie layers comprising olefin copolymers with acrylic acid (EAA), and (iii) polyolefins grafted with one or more of maleic anhydride, epoxy glues, and PUR glues.

26. Photovoltaic module according to claim 15, wherein (b) is selected from the group consisting of (i) EVA films or hot-melts, (ii) a coextruded tie layer/TPO/tie layer with tie layers comprising olefin copolymers with acrylic acid (EAA), and (iii) polyolefins grafted with one or more of maleic anhydride, epoxy glues, and PUR glues.

27. Photovoltaic module according to claim 16, wherein (b) is selected from the group consisting of (i) EVA films or hot-melts, (ii) a coextruded tie layer/TPO/tie layer with tie layers comprising olefin copolymers with acrylic acid (EAA), and (iii) polyolefins grafted with one or more of maleic anhydride, epoxy glues, and PUR glues.

* * * * *